(12) United States Patent
Shen et al.

(10) Patent No.: US 7,829,936 B2
(45) Date of Patent: Nov. 9, 2010

(54) SPLIT CHARGE STORAGE NODE INNER SPACER PROCESS

(75) Inventors: Minghao Shen, Sunnyvale, CA (US); Shenqing Fang, Fremont, CA (US); Wai Lo, Palo Alto, CA (US); Christie R. K. Marrian, San Jose, CA (US); Chungho Lee, Sunnyvale, CA (US); Ning Cheng, San Jose, CA (US); Fred Cheung, San Jose, CA (US); Huaqiang Wu, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 146 days.

(21) Appl. No.: 11/873,822

(22) Filed: Oct. 17, 2007

(65) Prior Publication Data

US 2009/0101963 A1 Apr. 23, 2009

(51) Int. Cl.
*H01L 21/331* (2006.01)
(52) U.S. Cl. .............................. 257/324; 257/E21.179; 257/E21.422; 257/E21.68; 438/361
(58) Field of Classification Search ................. 257/324, 257/E21.179, E21.422, E21.68; 438/361
See application file for complete search history.

(56) References Cited

U.S. PATENT DOCUMENTS

2005/0255651 A1* 11/2005 Qian et al. ................... 438/257
2007/0161191 A1* 7/2007 Yuan et al. ................... 438/257
2008/0303067 A1* 12/2008 Rao et al. .................... 257/288

* cited by examiner

*Primary Examiner*—Thao X Le
*Assistant Examiner*—Matthew Gordon
(74) *Attorney, Agent, or Firm*—Turocy & Watson, LLP

(57) ABSTRACT

Methods of forming a memory cell containing two split sub-lithographic charge storage nodes on a semiconductor substrate are provided. The methods can involve forming two split sub-lithographic charge storage nodes by using spacer formation techniques. By removing exposed portions of a first poly layer while leaving portions of the first poly layer protected by the spacers, the method can provide two split sub-lithographic first poly gates. Further, by removing exposed portions of a charge storage layer while leaving portions of the charge storage layer protected by the two split sub-lithographic first poly gates, the method can provide two split, narrow portions of the charge storage layer, which subsequently form two split sub-lithographic charge storage nodes.

16 Claims, 9 Drawing Sheets

US 7,829,936 B2

SPLIT CHARGE STORAGE NODE INNER SPACER PROCESS

TECHNICAL FIELD

The subject invention generally relates to a memory cell containing two split sub-lithographic first poly gates and two split sub-lithographic charge storage nodes on a semiconductor substrate and methods of forming the memory cell.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). This may include lengths of drain-source channel, storage node, and the like. The requirement of small features with close spacing between adjacent features requires sophisticated manufacturing techniques.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides a memory cell containing two split sub-lithographic first poly gates and two split charge storage nodes on a semiconductor substrate. Another aspect of the subject invention provides methods of forming a memory cell containing two split sub-lithographic first poly gates and two split sub-lithographic charge storage nodes on a semiconductor substrate. The method can involve forming two split sub-lithographic first poly gates and two split sub-lithographic charge storage nodes by using spacer formation techniques. By removing exposed portions of a first poly layer while leaving portions of the first poly layer protected by the spacers, the method can provide two split sub-lithographic first poly gates. Further, by removing exposed portions of a charge storage layer while leaving portions of the charge storage layer protected by the two split sub-lithographic first poly gates, the method can provide two split, narrow portions of the charge storage layer, which subsequently form two split sub-lithographic charge storage nodes. The method further can involve forming a dielectric between the two split sub-lithographic charge storage nodes. Since the memory cell has the two split sub-lithographic charge storage nodes separated by the dielectric, the memory cell can have two physically distinct bits.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
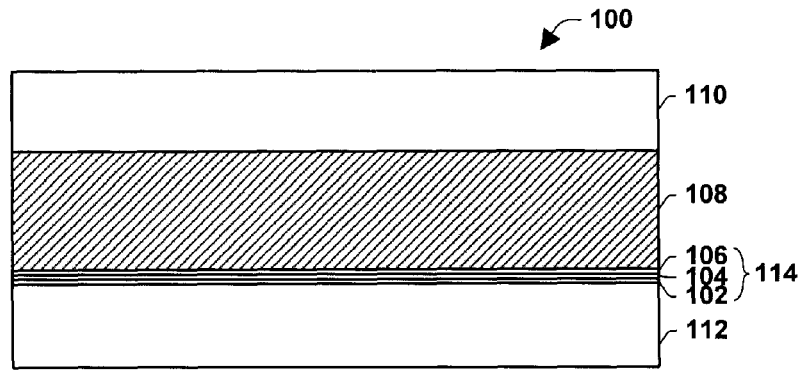
FIG. 1 illustrates a cross sectional view of an intermediate state of a portion of an exemplary semiconductor structure containing a tri-layer, a first poly layer, and a first mask layer over a semiconductor substrate in accordance with an aspect of the subject invention.

The subject invention provides methods of forming a memory cell containing two split sub-lithographic sized charge storage nodes using spacer formation techniques. The sub-lithographic charge storage nodes may be formed into any type of electrical structure including a memory cell, such as a flash memory cell used in a non-volatile memory device. By removing exposed portions of a first poly layer while leaving portions of the first poly layer protected by the spacers, the method can provide two split sub-lithographic first poly gates. Further, by removing exposed portions of a charge storage layer while leaving portions of the charge storage layer protected by the two split sub-lithographic first poly gates, the method can provide two split, narrow portions of the charge storage layer. Each of the small structures subsequently forms a sub-lithographic charge storage node of a memory cell.

Consequently, the length of the sub-lithographic charge storage node formed is dependent upon spacer formation techniques rather than photolithography techniques. In other words, the length of the sub-lithographic charge storage node is controlled and/or determined mainly by the limitations of spacer formation techniques rather than the limitations of photolithography techniques. Moreover, the two sub-lithographic charge storage nodes can be separated by a dielectric such as oxides, thereby preventing and/or mitigating a signal crossover between the two sub-lithographic charge storage nodes. As a result, the sub-lithographic charge storage nodes may be formed in a reliable manner and can have dimensions less than a minimum dimension achievable by a resolution limit of lithography. The subject invention therefore effectively addresses the concerns raised by the trend towards the miniaturization of semiconductor devices.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention.

Referring to FIGS. 1 to 16, one of many possible exemplary embodiments of forming a memory cell containing two split sub-lithographic charge storage nodes is illustrated. FIG. 1 illustrates a cross sectional view of an intermediate state of a portion of an exemplary semiconductor structure 100.

The semiconductor structure 100 can contain a charge storage layer 114, a first poly layer 108, and a first mask layer 110 over a semiconductor substrate 112. The semiconductor structure 100 can further contain other layers/components. For example, the semiconductor structure 100 may contain a tunnel oxide (not shown) between the first oxide 102 and the semiconductor substrate 112.

In one embodiment, the semiconductor structure 100 is portion of a memory device. Examples of memory devices include a volatile memory and a non-volatile memory. Examples of volatile memory include RAM such as SRAM, DRAM, synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM). Examples of non-volatile memory include ROM, PROM, EPROM, EEPROM, or flash memory. For example, the semiconductor structure 100 is a portion of high-density core regions of a non-volatile memory device.

When the semiconductor structure 100 is a portion of a memory device, the semiconductor structure 100 can be either a portion of high-density core regions of a non-volatile memory device or a portion of low-density peripheral regions of a non-volatile memory device. The high-density core region typically includes one or more M×N array cores of individually addressable, substantially identical memory cells.

The semiconductor substrate 112 may contain any suitable semiconductor material on which electric devices such as memory cell transistors can be formed. Examples of semiconductor materials include silicon, gallium arsenide, indium phosphide, and the like.

The charge storage layer 114 is formed over the semiconductor substrate 112. The configuration and/or constituent of the charge storage layer 114 may vary and are not critical to the subject invention. The charge storage layer 114 generally can contain any suitable charge storage dielectric material. Examples of charge storage dielectric materials include nitrides (e.g., silicon nitride, silicon oxynitride, and silicon rich nitride), oxides, silicates, a high-k dielectric, for example, having a dielectric constant higher than that of silicon dioxide ($SiO_2$), and the like. In one embodiment, the charge storage dielectric material contains silicon nitride, silicon oxynitride, and/or silicon rich nitride. In another example, the charge storage material contains oxides or silicates containing Al, Ta, Hf, La, Zr, Ti, Nb, Cr, V, Y, Ce and/or Pr. The charge storage layer 114 can be formed by any suitable technique. For example, the storage element 114 can be formed by CVD, lithography, and etching techniques.

Typically, the charge storage layer 114 contains three separate layers: a first insulating layer, a charge storage dielectric layer, and a second insulating layer. The invention is hereinafter illustrated and described in the context of an exemplary cell containing a storage layer 114 that contains a first insulating layer 102, a charge storage dielectric layer 104, and a second insulating layer 106. The first and second insulating layers 102 and 106 are typically formed of an oxide dielectric such as silicon dioxide ($SiO_2$) and the charge storage dielectric layer 104 is generally formed of a nitride dielectric such as silicon nitride ($Si_xN_y$). The oxide-nitride-oxide configuration may be referred to as an ONO layer. Especially, when the nitride layer contains silicon rich nitride, the first oxide layer 102, nitride layer 104, and second oxide layer 106 may be referred to as an ORO tri-layer. The oxide-nitride-oxide tri-layer can be fabricated by forming a first silicon oxide layer 102, forming a silicon nitride layer 104 on the first silicon oxide layer, and forming a second silicon oxide layer 106 on the silicon nitride layer.

The heights of the first oxide layer 102 and second oxide layer 106 may vary and are not critical to the subject invention. The first oxide layer 102 and second oxide layer 106 have independently any suitable height that depends on the desired implementations and/or the semiconductor structure 100 being fabricated. In one embodiment, the heights of the first oxide layer 102 and second oxide layer 106 are independently about 1 nm or more and about 10 nm or less. In another embodiment, the heights of the first oxide layer 102 and second oxide layer 106 are independently about 2 nm or more and about 8 nm or less. In yet another embodiment, the heights of the first oxide layer 102 and second oxide layer 106 are independently about 3 nm or more and about 7 nm or less. In still yet another embodiment, the heights of the first oxide layer 102 and second oxide layer 106 are about 5 nm.

The height of the nitride layer 104 may vary and is not critical to the subject invention. The nitride layer 104 has any suitable height that depends on the desired implementations and/or the semiconductor structure 100 being fabricated. In one embodiment, the height of the nitride layer 104 is about 1 nm or more and about 20 nm or less. In another embodiment, the height of the nitride layer 104 is about 2 nm or more and about 15 nm or less. In yet another embodiment, the height of the nitride layer 104 is about 3 nm or more and about 10 nm or less. In still yet another embodiment, the height of the nitride layer 104 is about 7 nm.

The first poly layer 108 typically contains polysilicon. The height of the first poly layer 108 may vary and is not critical to the subject invention. The first poly layer 108 has any suitable height that depends on the desired implementations and/or the semiconductor structure 100 being fabricated. In one embodiment, the height of the first poly layer 108 is about 30 nm or more and about 300 nm or less. In another embodiment, the height of the first poly layer 108 is about 50 nm or more and about 200 nm or less. In yet another embodiment, the height of the first poly layer 108 is about 70 nm or more and about 150 nm or less. In still yet another embodiment, the height of the first poly layer 108 is about 100 nm.

The first mask layer 110 may contain any suitable mask material. Examples of mask materials include oxides such as silicon oxide ($Si_xO_y$) and silicon-dioxide ($SiO_2$); nitrides such as silicon nitride ($Si_xN_y$), silicon rich nitride, and oxygen rich nitride; and the like.

The height of the first mask layer 110 may vary and is not critical to the subject invention. The first mask layer 110 has any suitable height that depends on the desired implementations and/or the semiconductor structure 100 being fabricated. In one embodiment, the height of the first mask layer 110 is about 10 nm or more and about 200 nm or less. In another embodiment, the height of the first mask layer 110 is about 20 nm or more and about 150 nm or less. In yet another embodiment, the height of the first mask layer 110 is about 30 nm or more and about 100 nm or less. In still yet another embodiment, the height of the first mask layer 110 is about 60 nm.

Although not shown, an anti-reflective coating (ARC) can be formed on the first mask layer 110 for increasing resolution of a subsequent lithography process. Any suitable ARC material can be employed. For example, ARC contains oxides such as silicon oxide ($Si_xO_y$) and silicon-dioxide ($SiO_2$); nitrides such as silicon nitride ($Si_xN_y$), silicon rich nitride, and oxygen rich nitride; carbides such as silicon carbide ($Si_xC_y$); amorphous carbon; and the like.

Figure 2:
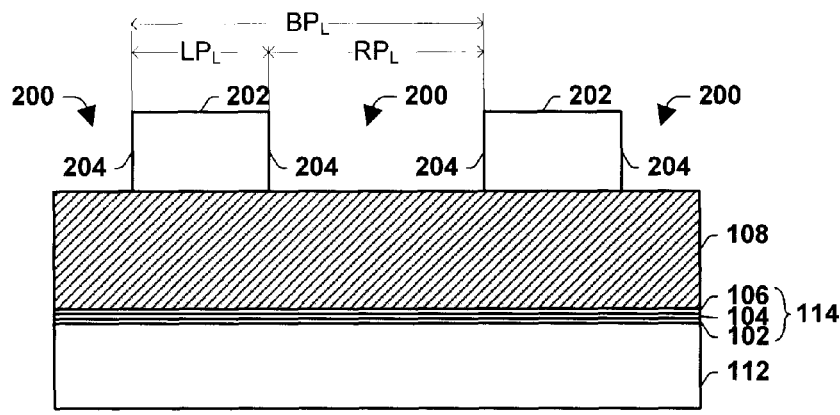
FIG. 2 illustrates patterning the first mask layer by removing portions of the first mask layer, thereby forming a patterned first mask layer in accordance with an aspect of the subject invention.

FIG. 2 illustrates patterning the first mask layer 110 by removing portions 200 of the first mask layer 110 on the semiconductor substrate 112, thereby forming a patterned first mask layer (e.g., left portions of the first mask layer 110) 202. The patterned first mask layer 202 has side surfaces 204. The removed portions 200 of the first mask layer 110 can be removed by employing any suitable technique. For example, the portions 200 are removed by lithography and etching techniques. Any suitable etching process can be used. For example, a plasma etch can be used to remove the portions 200.

The removed portions 200 of the first mask layer 110 correspond to positions on which two charge storage nodes and one bit line therebetween are formed in subsequent processes. The left portions 202 of the first mask layer 110 correspond to positions on which a second poly gate or center poly gate is formed in subsequent processes. The detailed configuration of the semiconductor structure 100 is described below.

For simplicity of illustration in FIG. 2, three removed portions 200 and two left portions 202 of the first mask layer are shown. However, the semiconductor structure 100 can have any suitable number of removed portions and left portions of the first mask layer. For example, the semiconductor structure 100 can have a M×N array of left portions 202 with M rows and N columns.

The patterned first mask layer 202 has any suitable length of the removed portion 200 and left portion 202 that depend on the desired implementations and/or the semiconductor structure 100 being fabricated. The length ($RP_L$) of the removed portions 200 and length ($LP_L$) of the left portions 202 may vary and are not critical to the subject invention. In one embodiment, the length ($RP_L$) of the removed portion 200 is about 40 nm or more and about 200 nm or less. In another embodiment, the length ($RP_L$) of the removed portion 200 is about 50 nm or more and about 180 nm or less. In yet another embodiment, the length ($RP_L$) of the removed portion 200 is about 60 nm or more and about 150 nm or less. In still yet another embodiment, the length ($RP_L$) of the removed portion 200 is about 110 nm. With respect to the length ($LP_L$) of left portion 202, in one embodiment, it is about 30 nm or more and about 150 nm or less. In another embodiment, the length ($LP_L$) of the left portion 202 is about 40 nm or more and about 130 nm or less. In yet another embodiment, the length ($LP_L$) of the left portion 202 is about 50 nm or more and about 100 nm or less. In still yet another embodiment, the length ($LP_L$) of the left portion 202 is about 70 nm.

The length of a set of one removed portion 200 and one left portion 202 may be referred to as a bit line pitch. The bit line pitch ($BP_L$) may vary and is not critical to the subject invention. The patterned first mask layer has any suitable length of pitch that depends on the desired implementations and/or the semiconductor structure 100 being fabricated. In one embodiment, the bit line pitch is about 60 nm or more and about 350 nm or less. In another embodiment, the bit line pitch is about 80 nm or more and about 310 nm or less. In yet another embodiment, the bit line pitch is about 100 nm or more and about 250 nm or less. In still yet another embodiment, the bit line pitch is about 180 nm.

Figure 3:
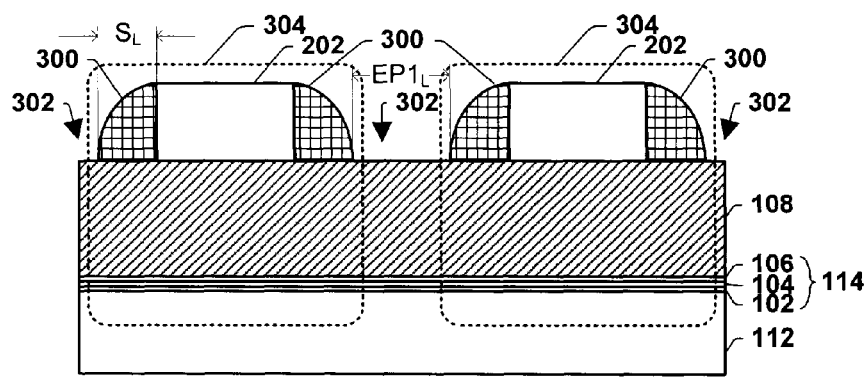
FIG. 3 illustrates forming spacers adjacent side surfaces of the patterned first mask layer and on portions of an upper surface of the first poly layer in accordance with an aspect of the subject invention.

FIG. 3 illustrates forming spacers 300 adjacent the side surfaces 204 of the patterned first mask layer 202 and on portions of the upper surface of the first poly layer 108. In this example, the spacer 300 is formed over a side surface 204 of the patterned first mask layer 202. The spacers 300 can serve as a mask for forming sub-lithographic first poly gates and charge storage nodes in subsequent processes. The first poly layer 108 has exposed portions 302 that are not covered with the spacer 300 and patterned first mask layer 202. The upright side surfaces of the spacers 300 in a portion of a subsequently formed memory cell 304 face each other inwardly. In other words, the upright side surfaces of the spacers 300 face each other in the inner direction of the subsequently formed memory cell 304.

The spacer 300 can contain any suitable material so that the spacer 300 can serve as a mask for protecting the covered portion of the first poly layer 108 when removing unmasked portions of the first poly layer 108. That is, the spacer material can be selected so that there is etch selectivity between the first poly layer 108 and the spacer 300.

The spacer material can have a lower etch rate than the first poly layer 108 in a subsequent etching process. For example, an etching rate of a nitride material is markedly slower than an etching rate of polysilicon with respect to a polysilicon etchant. Accordingly, in one embodiment, the spacer 300 contains a nitride material when the first poly layer 108 contains polysilicon. Examples of nitride materials include silicon oxynitride, silicon nitride, and the like. In another embodiment, diamond-like carbon and/or silicon carbide can be employed as a spacer 300.

The spacer 300 can be formed by any suitable method, for example, forming a layer containing the spacer material over the substrate 112 and then removing portions of the spacer material layer not near the side surface 204 of the patterned first mask layer 202 to leave the spacer 300. A layer containing the spacer material can be formed at least over the side surface 204 of the first poly layer 108. For example, the spacer material layer can be formed by depositing a silicon nitride layer over the patterned first mask layer 202 and the first poly layer 108 by chemical vapor deposition (CVD).

After forming the spacer material layer, portions of the spacer material layer can be removed by, for example, etching, thereby forming a spacer 300. Any suitable etching can be used as long as the etching can leave a spacer 300 adjacent the side surface 204 of the patterned first mask layer 202 and on a portion of the upper surface of the first poly layer 108. Examples of etching include reactive ion etching, chemical plasma etching, or other suitable anisotropic etching utilizing a suitable chemistry.

Choice of a suitable process and reagents of etching depends on, for example, the spacer material, the length and height of the spacer material, the desired implementations and/or the semiconductor structure 100 being fabricated, and the like. In one embodiment, reactive ion etching is used with an appropriate etchant for the selected spacer material. For example, when the spacer 300 contains silicon nitrides, examples of etchants include $CF_4$ or $CHF_3$. In another embodiment, when the spacer 300 contains diamond-like carbon, examples of etchants include oxygen-based plasma. In yet another embodiment, when the spacer 300 contains silicon carbides, examples of etchants include $CF_4$, $CH_2F_2$, or $C_2F_6$.

The spacer 300 can serve as a mask for protecting a narrow portion of the first poly layer 108 and tri-layer 114 when etching the exposed portions of the first poly layer 108 and tri-layer 114 in subsequent etching as described below. As a result, the length ($S_L$) of the spacer 300 can control and/or determine a length of the resultant sub-lithographic first poly gate and charge storage node. That is, the length of the spacer 300 corresponds to the length of the subsequently formed sub-lithographic first poly gate and charge storage node. The length ($S_L$) of the spacer 300 may be reduced during the subsequent etching. When the length ($S_L$) of the spacer 300 is reduced during the subsequent etching, the reduced length of the spacer 300 can control and/or determine a length of the resultant sub-lithographic first poly gate and charge storage node.

The spacer 300 can have any suitable length ($S_L$) that depends on, for example, the desired length of the sub-lithographic charge storage node, the desired implementations and/or the semiconductor structure 100 being fabricated, and the like. In one embodiment, the spacer 300 has a length ($S_L$) of about 5 nm or more and about 50 nm or less. In another embodiment, the spacer 300 has a length ($S_L$) of about 10 nm or more and about 40 nm or less. In yet another embodiment, the spacer 300 has a length ($S_L$) of about 15 nm or more and about 35 nm or less. In still yet another embodiment, the spacer 300 has a length ($S_L$) of about 30 nm.

The exposed portions 302 of the first poly layer 108 that are not covered with the spacer 300 and patterned first mask layer 202 are removed to form a first opening in the first poly layer 108 or bit line opening in subsequent processes, and a bit line is formed in the semiconductor substrate 112 under the first opening or bit line opening in subsequent processes. As a result, the length ($EP1_L$) of the exposed portion 302 of the first poly layer 108 that is not covered with the spacer 300 and patterned first mask layer 202 can control and/or determine a length of the resultant first opening or bit line opening. That is, the length ($EP1_L$) of the exposed portion 302 of the first poly layer 108 substantially corresponds to the length of the subsequently formed first opening or bit line opening. The length ($EP1_L$) of the exposed portion may be increased during the subsequent etching. When the length ($EP1_L$) of the exposed portion 302 is increased during the subsequent etching, the increased length of the exposed portion 302 can control and/or determine a length of the subsequently formed first opening or bit line opening.

The exposed portion 302 of the first poly layer 108 that is not covered with the spacer 300 and patterned first mask layer 202 can have any suitable length ($EP1_L$) that depends on, for example, the desired length of the sub-lithographic charge storage node, the desired implementations and/or the semiconductor structure 100 being fabricated, and the like. In one embodiment, the exposed portion 302 has a length ($EP1_L$) of about 5 nm or more and about 190 nm or less. In another embodiment, the exposed portion 302 has a length ($EP1_L$) of about 20 nm or more and about 100 nm or less. In yet another embodiment, the exposed portion 302 has a length ($EP1_L$) of about 30 nm or more and about 70 nm or less. In still yet another embodiment, the exposed portion 302 has a length ($EP1_L$) of about 50 nm.

Figure 4:
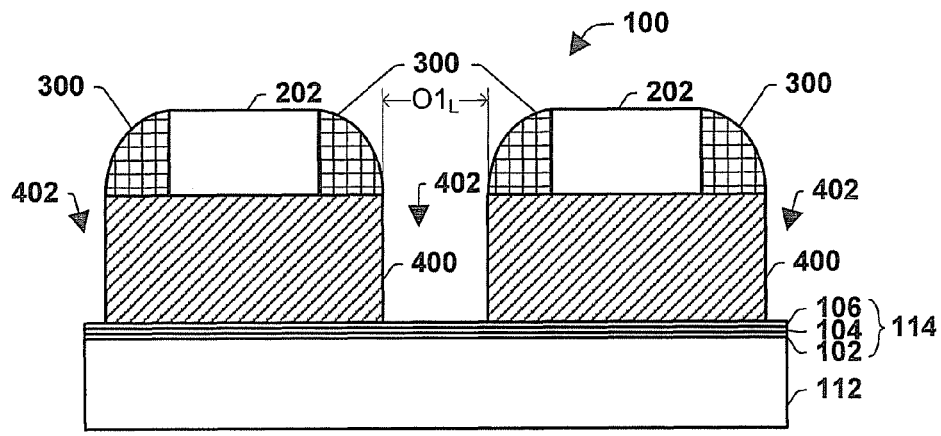
FIG. 4 illustrates patterning the first poly layer by removing exposed portions of first poly layer that are not covered with the patterned first mask layer and the spacer, thereby forming a patterned first poly layer and a first opening in of the first poly layer in accordance with an aspect of the subject invention.

FIG. 4 illustrates patterning the first poly layer 108 by removing exposed portions 302 of first poly layer 108 that are not covered with the patterned first mask layer 202 and the spacer 300, thereby forming a patterned first poly layer 400 and a first opening 402 in the first poly layer 108. The spacer 300 and the patterned first mask layer 202 can serve as a mask for forming the patterned first poly layer 108 and forming the first opening 402. The first opening 402 is formed at a portion of a bit line of a subsequently formed memory cell.

The exposed portions 302 of the first poly layer 108 can be removed by any suitable technique, for example, etching. For example, the exposed portions 302 of the first poly layer 108 can be removed by contacting the first poly layer 108 with any suitable polysilicon etchant that does not substantially damage and/or remove other components of the semiconductor structure 100 such as the spacer 300 and the patterned first mask layer 202. Examples of polysilicon etchants include tetraalkylammonium hydroxides (e.g., tetramethylammonium hydroxide (TMAH)) and alkali metal hydroxides (e.g., a potassium hydroxide (KOH) and cerium hydroxide (CeOH)). Other polysilicon etchants can also be used as long as they are capable of removing the exposed portions 302 of the first poly layer 108 selective to the spacer 300 and the patterned first mask layer 202. In one embodiment, when the spacer 300 contains nitrides and the patterned first mask layer 202 contains oxides, the polysilicon etchant has a selectivity of about 1,000:1 or more for polysilicon versus nitrides and oxides. In another embodiment, the polysilicon etchant has a selectivity of about 5,000:1 or more for polysilicon versus nitrides and oxides.

The length ($O1_L$) of the first opening 402 can be controlled and/or determined by the length ($EP1_L$) of the exposed portion 302 of the first poly layer 108 that is not covered with the spacer 300 and patterned first mask layer 202. Thus, the length ($O1_L$) of the first opening 402 is the substantially same as the length ($EP1_L$) of the exposed portion 302 of the first poly layer 108.

Figure 5:
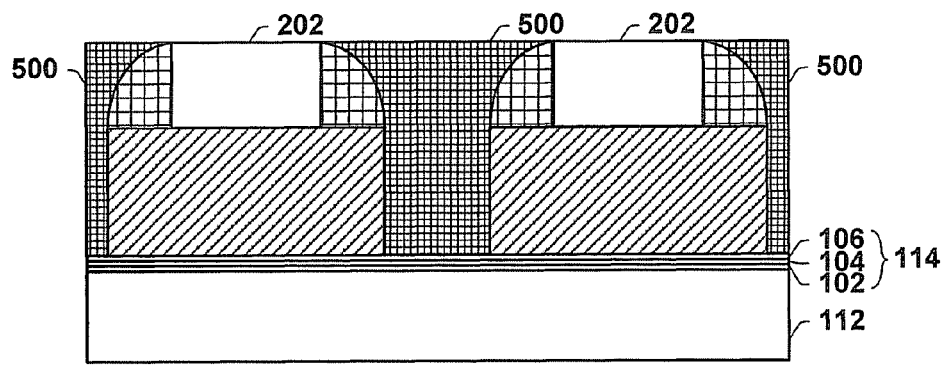
FIG. 5 illustrates forming a second mask layer at the first opening in accordance with an aspect of the subject invention.

FIG. 5 illustrates forming a second mask layer 500 at the first opening 402. The second mask layer 500 can contain any suitable material so that the second mask layer 500 can serve as a mask for protecting the covered portion of the first poly layer 108 when removing unmasked portions of the first poly layer 108. That is, the second mask layer material can be selected so that there is etch selectivity between the first poly layer 108 and the second mask layer 500. For example, the second mask layer 500 contains any of the materials of the spacer 300 as described above in connection with FIG. 3. In one embodiment, the second mask layer 500 contains the same material as the spacer 300.

The second mask layer 500 can be formed by any suitable technique, for example, CVD. If necessary, the upper portion of the formed second mask layer 500 may be removed by, for example, etching so that the upper surface of the second mask layer 500 is substantially coplanar with the upper surface of the patterned first mask layer 202.

Figure 6:
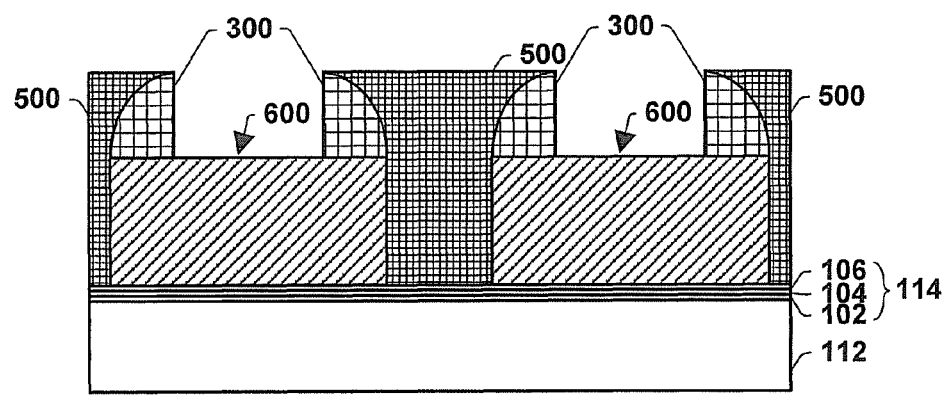
FIG. 6 illustrates removing the patterned first mask layer on the patterned first poly layer, thereby forming exposed portions of the patterned first poly layer in accordance with an aspect of the subject invention.

FIG. 6 illustrate removing the patterned first mask layer 202 on the patterned first poly layer 400, thereby forming exposed portions 600 of the patterned first poly layer 400 that are not covered by the spacers 300 and the second mask layer 500. The patterned first mask layer 202 can be removed by any suitable technique, for example, etching. For example, the patterned first mask layer 202 can be removed by contacting the patterned first mask layer 202 with any suitable etchant that does not substantially damage and/or remove other components of the semiconductor structure 100 such as the spacer 300, the second mask layer 500, and the first poly layer 108. When the patterned first mask layer 202 contains an oxide material, an oxide etchant can be employed to remove the patterned first mask layer 202. Examples of oxide etchants include halogen acids such as hydrofluoric acid. In one embodiment, the oxide etchant is a hydrofluoric acid solution. In another embodiment, the oxide etchant is a vapor of hydrofluoric acid.

Figure 7:
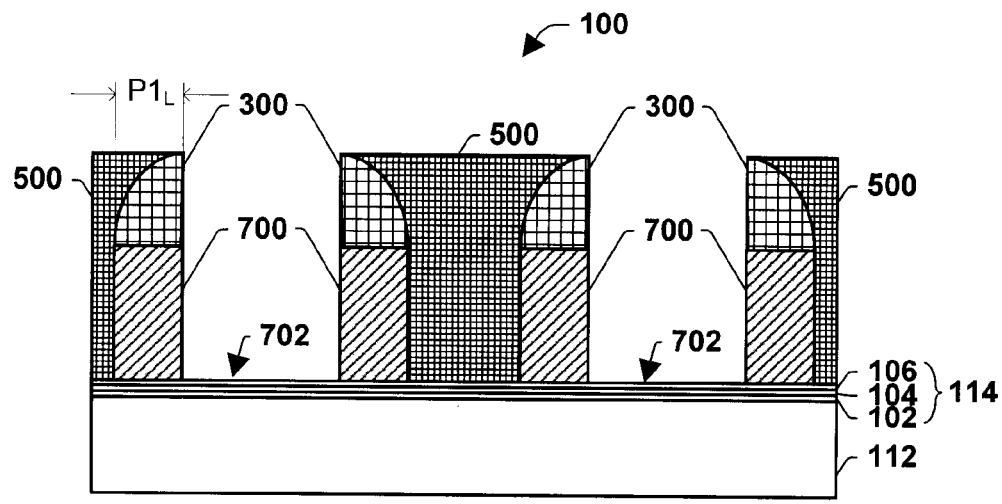
FIG. 7 illustrates removing the exposed portions of first poly layer, thereby forming sub-lithographic first poly gates and exposing portions of the tri-layer in accordance with an aspect of the subject invention.

FIG. 7 illustrates removing the exposed portions 600 of patterned first poly layer 400, thereby forming two split sub-lithographic first poly gates 700 and exposing portions 702 of the tri-layer 114 that are not covered by the sub-lithographic first poly gates 700 and second mask layer 500. The spacer 300 and the patterned first mask layer 202 can serve as a mask for forming the sub-lithographic first poly gate 700.

The exposed portions 600 of the first poly layer 108 can be removed by any suitable technique, for example, etching. For example, the exposed portions 600 of the first poly layer 108 can be removed in the same manner as described above for removing the exposed portions 302 of first poly layer 108 that are not covered with the patterned first mask layer 202 and the spacer 300 in connection with FIG. 4.

The sub-lithographic first poly gate 700 can have any suitable length ($P1_L$) that depends on, for example, the desired length of bit line pitch, the desired implementations and/or the semiconductor structure 100 being fabricated. The length ($P1_L$) of the sub-lithographic first poly gate 700 substantially corresponds to the length ($S_L$) of the spacer 300. In one embodiment, the sub-lithographic first poly gate 700 has a length ($P1_L$) of about 5 nm or more and about 50 nm or less. In another embodiment, the sub-lithographic first poly gate 700 has a length ($P1_L$) of about 10 nm or more and about 40 nm or less. In yet another embodiment, the sub-lithographic first poly gate 700 has a length ($P1_L$) of about 15 nm or more and about 35 nm or less. In still yet another embodiment, the sub-lithographic first poly gate 700 has a length ($P1_L$) of about 30 nm.

Figure 8:
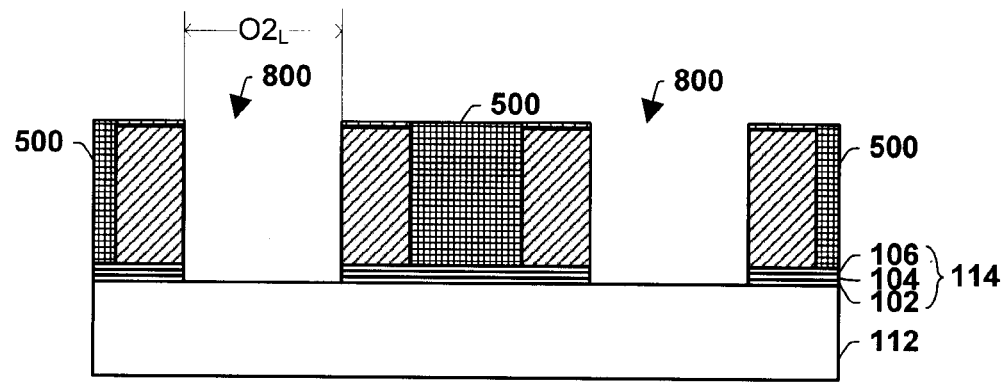
FIG. 8 illustrates removing the exposed portions of the tri-layer, thereby forming second openings in the patterned first poly layer in accordance with an aspect of the subject invention.

FIG. 8 illustrates removing the exposed portions 702 of the tri-layer 114 that are not covered by the sub-lithographic first poly gate 700 and second mask layer 500, thereby forming second openings 800 in the patterned first poly layer 400. Since the second opening 800 is formed under the left portion 202 of the first mask layer 110 (e.g., patterned first mask layer 202) as described in connection with FIG. 2, the length ($O2_L$) of the second opening 800 substantially corresponds to the length ($LP_L$) of the left portion 202 of the first mask layer 110.

The exposed portion 702 of tri-layer 114 can be removed by, for example, contacting the tri-layer 114 with any suitable etchant under any suitable condition that can remove the exposed portion of the tri-layer 114 but does not substantially damage and/or remove other components of the semiconductor structure 100 such as the sub-lithographic first poly gates 700. For example, two or more different etchants can be used to remove the exposed portions 702 of the tri-layer 114. Since the exposed portion 702 of tri-layer 114 contains the second oxide layer 106, the nitride layer 104, and the first oxide layer 102, any suitable oxide-nitride-oxide etch chemistry can be used. In one embodiment, hydrofluoric acid, phosphoric acid, and hydrofluoric acid are used in sequence to remove the exposed portions 702 of the tri-layer 114, respectively. In another embodiment, fluorine chemistry (e.g., $CHF_3$, $CF_4$) is used. While removing the exposed portions 702 of the tri-layer 114, the upper portions of the spacer 300 and second mask layer 500 on the patterned first poly layer 400 may be removed.

Figure 9:
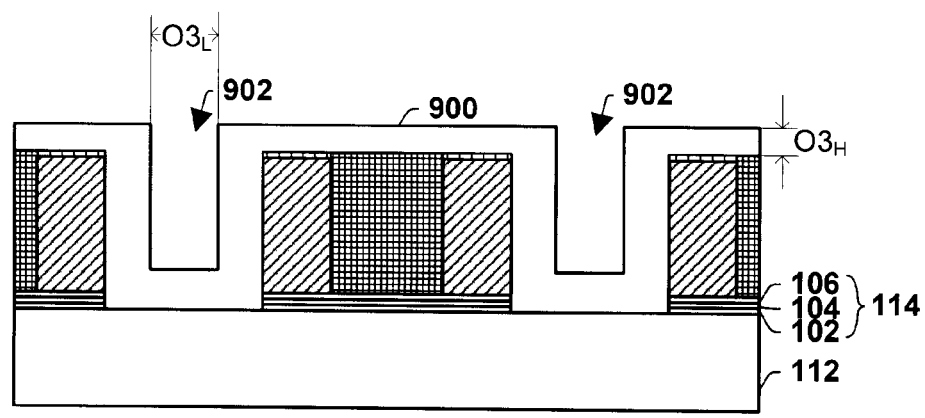
FIG. 9 illustrates forming a third oxide layer on the spacer and second mask layer and in the second opening over the semiconductor substrate, thereby forming a third opening in accordance with an aspect of the subject invention.

FIG. 9 illustrates forming a third oxide layer 900 over the sub-lithographic first poly gate 700 and the second mask layer 500 and in the second opening 800, thereby forming a third opening 902 in the second opening 800. The third oxide layer 900 can contain any suitable oxide material. Examples of oxides include silicon oxide, high temperature oxide (HTO), high density plasma (HDP) oxide, and the like.

In one embodiment, a third oxide layer 900 containing a HTO is formed by a HTO deposition process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the third oxide layer 900 is grown in plasma at low temperatures, e.g., plasma-grown oxide. For example, the oxide layer contains plasma-grown oxide that is grown at a temperature of about 250 degrees Celsius or more and about 600 degrees Celsius or less. The oxide layer may be formed by a HDP deposition process. In yet another embodiment, the third oxide layer 900 is formed using a Slot Plane Antenna (SPA) process. In the SPA process, plasma-grown oxide is grown in a chamber that includes a microwave slot antenna, which is used to generate the plasma. The microwave slot antenna can be configured to provide a plasma distribution that results in a plasma-grown oxide that has increased uniformity, conformity, and quality compared to conventional plasma oxide. In the SPA process, the species used to grow the oxide can contain one or more of oxygen, argon, or hydrogen, for example. The third oxide layer 900 can be optionally subjected to an anneal in, for example, a nitrogen ambient at about 1000 degrees Celsius for thirty minutes.

In one embodiment, the third oxide layer 900 does not completely fill the second opening 800, and after forming the third oxide layer 900, there is a third opening 902 in the second opening 800. The third opening 902 can have any suitable length that depends on, for example, the desired length of a subsequently formed second poly gate, the desired implementations and/or the semiconductor structure 100 being fabricated. The length ($O3_L$) of the third opening 902 is generally equal to the length ($O2_L$) of second opening 800 minus twice the height ($O3_H$) of the third oxide layer 900. In one embodiment, the length ($O3_L$) of the third opening 902 is about 10 nm or more and about 100 nm or less. In another embodiment, the length ($O3_L$) of the third opening 902 is about 15 nm or more and about 70 nm or less. In yet another embodiment, the length ($O3_L$) of the third opening 902 is about 20 nm or more and about 50 nm or less. In still yet another embodiment, length ($O3_L$) of the third opening 902 is about 30 nm. In another embodiment, the third oxide layer 900 fills the second opening 800 and there is no opening in the second opening 800 (not shown).

The third oxide layer 900 can have any suitable height ($O3_H$) that depends on, for example, the desired length of third opening, the desired implementations and/or the semiconductor structure 100 being fabricated. In one embodiment, the height ($O3_H$) of the third oxide layer 900 is about 5 nm or more and about 50 nm or less. In another embodiment, the height ($O3_H$) of the third oxide layer 900 is about 10 nm or more and about 40 nm or less. In yet another embodiment, the height ($O3_H$) of the third oxide layer 900 is about 15 nm or more and about 30 nm or less. In still yet another embodiment, the height ($O3_H$) of the third oxide layer 900 is about 20 nm.

Figure 10:
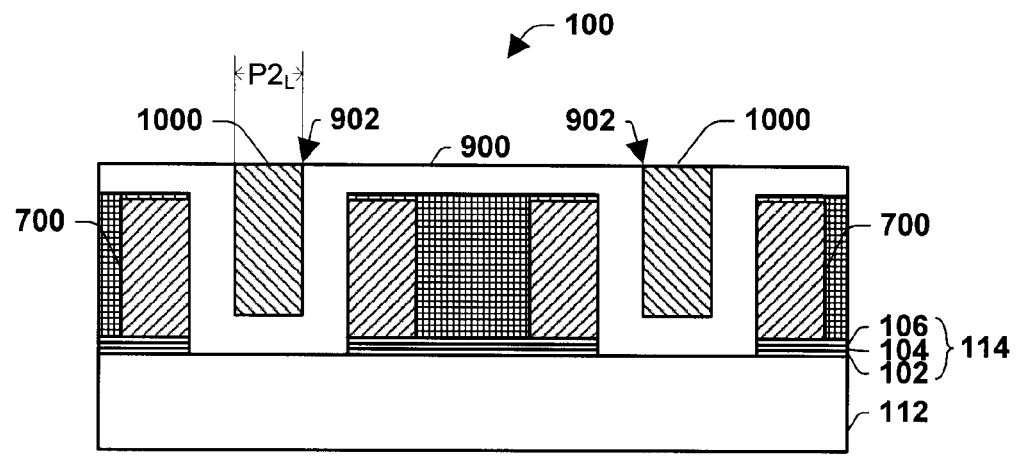
FIG. 10 illustrates forming a second poly gate in the third opening in accordance with an aspect of the subject invention.

FIG. 10 illustrates forming a second poly gate 1000 in the third opening 902. The second poly gate 1000 may be referred to as a center poly gate. The second poly gate 1000 typically contains polysilicon. The second poly gate 1000 can be formed in the third opening 902 by, for example, forming a second poly layer over the semiconductor substrate 112 via CVD and etching back the second poly layer to the surface of the third oxide layer 900. When the third oxide layer 900 fills the second opening 800 and there is no opening in the second opening 800, a second poly gate is not formed (not shown).

The second poly gate 1000 can have any suitable length ($P2_L$) that depends on, for example, the desired implementations and/or the semiconductor structure 100 being fabricated. In one embodiment, the length ($P2_L$) of the second poly gate 1000 is about 10 nm or more and about 100 nm or less. In another embodiment, the length ($P2_L$) of the second poly gate 1000 is about 15 nm or more and about 70 nm or less. In yet another embodiment, the length ($P2_L$) of the second poly gate 1000 is about 20 nm or more and about 50 nm or less. In still yet another embodiment, the length ($P2_L$) of the second poly gate 1000 is about 30 nm.

The upper surface of the second poly gate 1000 may be higher than the upper surface of the sub-lithographic first poly gate 700. In one embodiment, the upper surface of the second poly gate 1000 is higher than the upper surface of the sub-lithographic first poly gate 700 by about 5 nm or more and about 30 nm or less. In another embodiment, the upper surface of the second poly gate 1000 is higher than the upper surface of the sub-lithographic first poly gate 700 by about 10 nm or more and about 20 nm or less.

Figure 11:
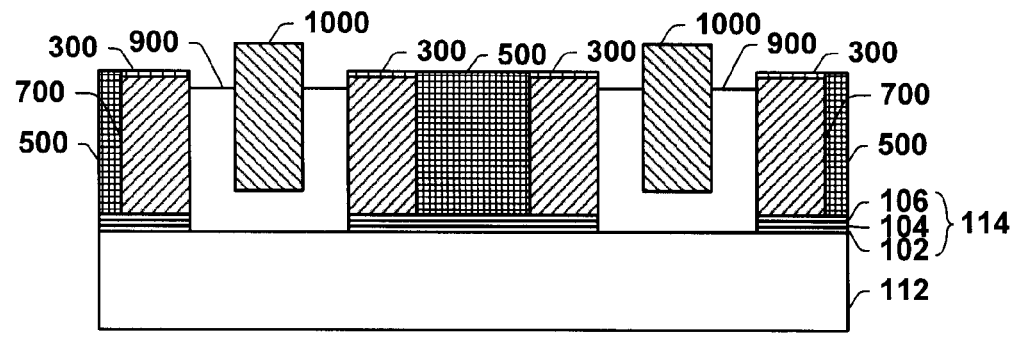
FIG. 11 illustrates removing portions of the third oxide layer on the spacer and second mask layer, thereby exposing the upper portions of the spacer and second mask layer in accordance with an aspect of the subject invention.

FIG. 11 illustrates removing portions of the third oxide layer 900 on the spacer 300 and second mask layer 500, thereby exposing the upper portions of the spacer 300 and second mask layer 500. The portions of the third oxide layer 900 can be removed by any suitable technique. For example, the portions of the third oxide layer 900 can be removed by contacting the third oxide layer 900 with any suitable oxide etchant. Examples of oxide etchants include halogen acids such as hydrofluoric acid. By removing the portions of the third oxide layer 900 on the spacer 300 and second mask layer 500, the spacer 300 and second mask layer 500 can be exposed.

Figure 12:
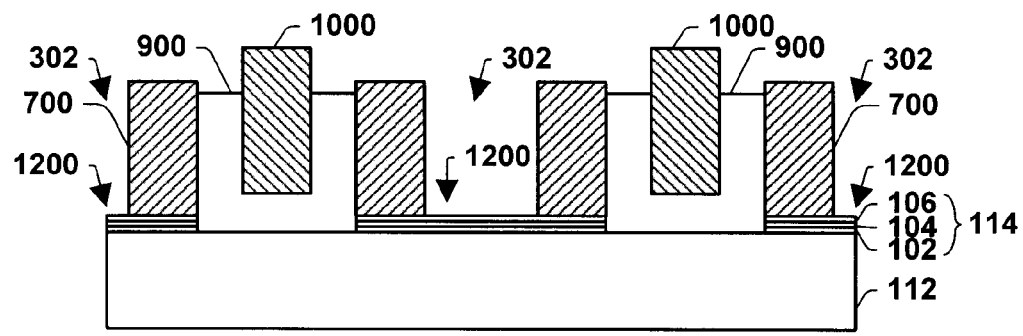
FIG. 12 illustrates removing the spacer and second mask layer on the semiconductor substrate, thereby exposing portions of the tri-layer at the bottom of the first opening in accordance with an aspect of the subject invention.

FIG. 12 illustrates removing the spacer 300 and second mask layer 500 on the semiconductor substrate 112, thereby exposing portions 1200 of the tri-layer 114 at the bottom of the first opening 402. The spacer 300 and second mask layer 500 can be removed by any suitable technique. For example, the spacer 300 and second mask layer 500 can be removed by contacting the spacer 300 and second mask layer 500 with any suitable etchant. When the spacer 300 and second mask layer 500 contain nitrides, the spacer 300 and second mask layer 500 are removed by contacting the spacer 300 and second mask layer 500 with any suitable nitride etchant. Examples of nitride etchants include phosphoric acid. The spacer 300 and second mask layer 500 are contacted with a suitable nitride etchant under conditions that the etchant do not substantially remove and/or damage other components of the semiconductor structure 100 such as the sub-lithographic first poly gates 700, second poly gate 1000, and tri-layer 114.

Figure 13:
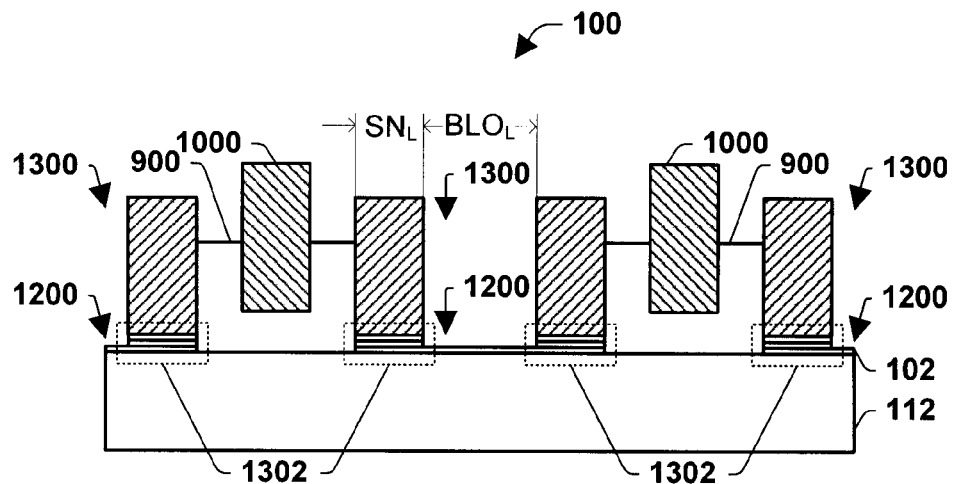
FIG. 13 illustrates removing at least portion of exposed portions of the tri-layer at the bottom of the first opening, thereby forming a bit line opening and sub-lithographic charge storage nodes on the semiconductor substrate in accordance with an aspect of the subject invention.

FIG. 13 illustrates removing at least portion of exposed portions 1200 of the tri-layer 114 at the bottom of the first opening 402, thereby forming two split sub-lithographic charge storage nodes 1302 and a bit line opening 1300 on the semiconductor substrate 112. The exposed portions 1200 of the tri-layer 114 are at the bottom of the first opening 402 and not covered by the sub-lithographic first poly gates 700 and the third oxide layer 900. A bit line is formed under the bit line opening 1300 in subsequent processes.

In one embodiment, a portion of the exposed portion 1200 of the tri-layer 114 is removed, and the rest of the exposed portion 1200 of the tri-layer 114 remains on the semiconductor substrate 112. For example, the second oxide layer 106, the nitride layer 104, and an upper portion of the first oxide layer 102 of the exposed portion 1200 of the tri-layer 114 are removed, and the rest of the first oxide layer 102 having a height of, for example, about 10 nm or more and about 20 nm or less remains. In another embodiment, substantially all of the exposed portions 1200 of the tri-layer 114 are removed (not shown). When removing the exposed portion 1200 of the tri-layer 114, upper portions of the third oxide layer 900 may be removed.

The exposed portion 1200 of tri-layer 114 can be removed by any suitable technique. The exposed portion 1200 of tri-layer 114 can be removed by, for example, contacting the exposed portion 1200 of the tri-layer 114 with any suitable etchant under any suitable condition that can remove the exposed portion 1200 of the tri-layer 114 but does not substantially damage and/or remove other components of the semiconductor structure 100 such as the sub-lithographic first poly gates 700. For example, two or more different etchants can be used to remove the exposed portions 1200 of the tri-layer 114. Since the exposed portion 1200 of tri-layer 114 contains the second oxide layer 106, the nitride layer 104, and the first oxide layer 102, any suitable oxide-nitride-oxide etch chemistry can be used. In one embodiment, hydrofluoric acid, phosphoric acid, and hydrofluoric acid are used in sequence to remove the three layers, respectively. In another embodiment, fluorine chemistry (e.g., $CHF_3$, $CF_4$) is used.

The length ($SN_L$) of the sub-lithographic charge storage node 1302 can be controlled and/or determined primarily by the specific identity of the spacer material and/or the length ($S_L$) of the spacer 300. The sub-lithographic charge storage node 1302 can have any suitable length ($SN_L$) that depends on, for example, the desired bit line pitch, the desired implementations, and/or the semiconductor structure 100 being fabricated. In one embodiment, the sub-lithographic charge storage node 1302 has a length ($SN_L$) of about 5 nm or more and about 50 nm or less. In another embodiment, the sub-lithographic charge storage node 1302 has a length ($SN_L$) of about 10 nm or more and about 40 nm or less. In yet another embodiment, the sub-lithographic charge storage node 1302 has a length ($SN_L$) of about 15 nm or more and about 35 nm or less. In still yet another embodiment, the sub-lithographic charge storage node 1302 has a length ($SN_L$) of about 30 nm.

The bit line opening 1300 can have any suitable length ($BLO_L$) that depends on, for example, the desired bit line pitch, the desired length of the sub-lithographic charge storage node, the desired implementations, and/or the semiconductor structure 100 being fabricated. In one embodiment, the bit line opening 1300 has a length ($BLO_L$) of about 5 nm or more and about 190 nm or less. In another embodiment, the bit line opening 1300 has a length ($BLO_L$) of about 20 nm or more and about 100 nm or less. In yet another embodiment, the bit line opening 1300 has a length ($BLO_L$) of about 30 nm or more and about 70 nm or less. In still yet another embodiment, the bit line opening 1300 has a length ($BLO_L$) of about 50 nm.

Figure 14:
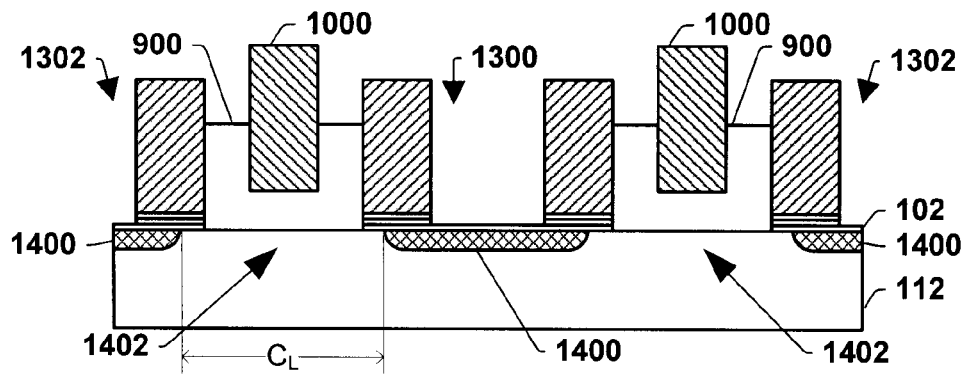
FIG. 14 illustrates implanting portions of the semiconductor substrate through the bit line opening in accordance with an aspect of the subject invention.

FIG. 14 illustrates implanting portions of the semiconductor substrate 112 through the bit line opening 1300, thereby forming implanted portions (e.g., bit line) 1400 in the semiconductor substrate 112. The implanted portions 1400 can be formed in the semiconductor substrate 112 by any suitable implantation technique such as doping the substrate 112 with implant species (e.g., arsenic, antimony, phosphorus, boron, and argon). For example, a double diffusion implant (DDI) and a medium diffused drain (MDD) implant can be formed in the substrate 112. When the first oxide layer 102 remains at the bottom of the bit line opening 1300, the implant species can be implanted through the first oxide layer 102 into the semiconductor substrate 112. In this embodiment, the sub-lithographic first poly gate 700 and third oxide layer 900 serve as an implant screen. As a result of the implantation, when the semiconductor structure 100 is a portion of a non-volatile memory device, the implanted portion of the substrate 112 may be referred to as a source region or drain region, and some areas of the unimplanted portion 1402 of the substrate 112 may be referred to as a channel.

The length of unimplanted portion 1402 may be referred to as a channel length ($C_L$). The unimplanted portion 1402 can have any suitable channel length ($C_L$) that depends on, for example, the desired bit line pitch, the desired implementations, and/or the semiconductor structure 100 being fabricated. In one embodiment, the channel length ($C_L$) is about 40 nm or more and about 200 nm or less. In another embodiment, the channel length ($C_L$) is about 60 nm or more and about 150 nm or less. In yet another embodiment, the channel length ($C_L$) is about 70 nm or more and about 120 nm or less. In still yet another embodiment, the channel length ($C_L$) is about 90 nm.

Figure 15:
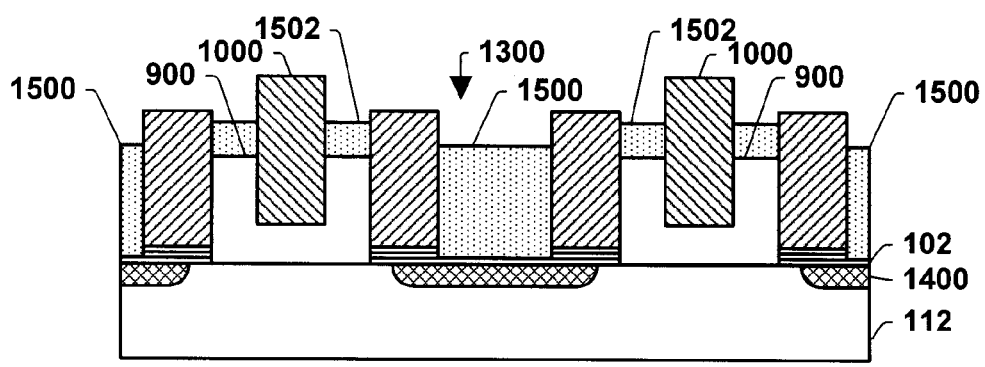
FIG. 15 illustrates forming a fourth oxide in the bit line opening in accordance with an aspect of the subject invention.

FIG. 15 illustrates forming a fourth oxide 1500 in the bit line opening 1300 on the semiconductor substrate 112. The fourth oxide 1500 can contain any suitable oxide material. Examples of oxides include silicon oxide, HTO, HDP oxide, and the like. Any suitable amount of the fourth oxide 1500 can be formed in the bit line opening 1300 so that the upper surfaces of the sub-lithographic poly gate 700 and second poly gate 1000 are exposed, and a leakage current from a word line to a bit line is prevented. In one embodiment, fourth oxides 1502 are also formed around the second poly gate 1000.

The fourth oxide 1500 can be formed any suitable technique. For example, the fourth oxide 1500 is formed in the bit line opening 1300 by forming a fourth oxide layer over the semiconductor substrate 112 and removing an upper portion of the fourth oxide layer. The fourth oxide layer can be formed on the semiconductor substrate 112 in the same manner as described above for forming the third oxide layer 900 in connection with FIG. 9.

The upper portion of the fourth oxide layer can be removed any suitable technique. For example, the upper portion of the fourth oxide layer is removed by chemical-mechanical polishing (CMP) and/or etching. For example, the upper portion of the fourth oxide layer is polished by CMP under any suitable condition to facilitate removing/polishing the upper portion. The conditions generally depend upon, for example, the thickness of the fourth oxide layer, the composition of the fourth oxide layer, the desired implementations and/or the semiconductor structure 100 being fabricated, and the like. In another embodiment, the upper portion of the fourth oxide layer is removed by contacting the upper portion with any suitable oxide etchant under any suitable condition that can remove the upper portion of the fourth oxide layer but does not substantially damage and/or remove other components of the semiconductor structure 100 such as the sub-lithographic first poly gate 700 and second poly gate 1000.

Figure 16:
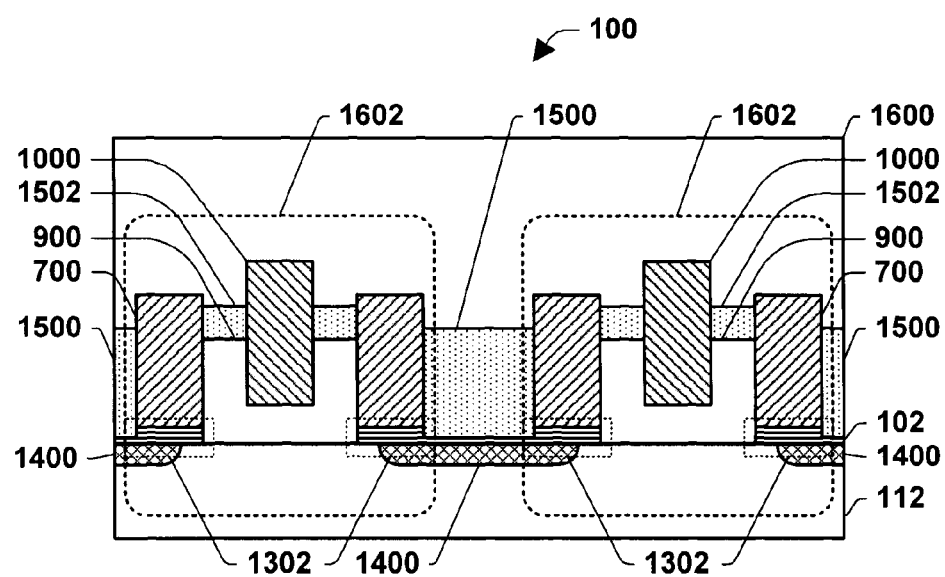
FIG. 16 illustrates forming a third poly gate over the semiconductor substrate, thereby forming a memory device in accordance with an aspect of the subject invention.

FIG. 16 illustrates forming a third poly gate 1600 over the semiconductor substrate 112, thereby forming a memory device 1602. The third poly gate 1600 typically contains polysilicon. The height of the third poly gate 1600 may vary and is not critical to the subject invention. The third poly gate 1600 has any suitable height that depends on the desired implementations and/or the semiconductor structure 100 being fabricated. In one embodiment, the height of the third poly gate 1600 is about 30 nm or more and about 300 nm or less. In another embodiment, the height of the third poly gate 1600 is about 50 nm or more and about 200 nm or less. In yet another embodiment, the height of the third poly gate 1600 is about 70 nm or more and about 150 nm or less. In still yet another embodiment, the height of the third poly gate 1600 is about 100 nm.

The memory cell 1602 contains the two split sub-lithographic charge storage nodes 1302 on the semiconductor substrate 112; the third oxide layer 900 between the two sub-lithographic charge storage nodes 1302; the implanted portions 1400 of the semiconductor substrate 112 under the two sub-lithographic charge storage nodes 1302; the two sub-lithographic first poly gates 700 on the two sub-lithographic charge storage nodes 1302; the second poly gate 1000 between the two sub-lithographic first poly gates 700; and the third poly gate 1600 over the two sub-lithographic charge storage nodes 1302. Since the memory cell 1602 has the two split sub-lithographic charge storage nodes 1302 separated by the third oxide layer 900, the memory cell 1602 can store two physically distinct bits. Each bit within the memory cell 1602 serves as a binary unit of data (e.g., either 1 or 0) that can be mapped directly to a memory array. Reading or programming one side of sub-lithographic charge storage nodes 1302 occurs independently of whatever data is stored on the opposite side of the sub-lithographic charge storage nodes 1302. Moreover, the third oxide 900 can prevent and/or mitigate undesirable signal crossover (e.g., crosstalk) between the two sub-lithographic charge storage nodes 1302. As a result, the memory cell 1602 can provide exceptional read and write performance.

Figure 17:
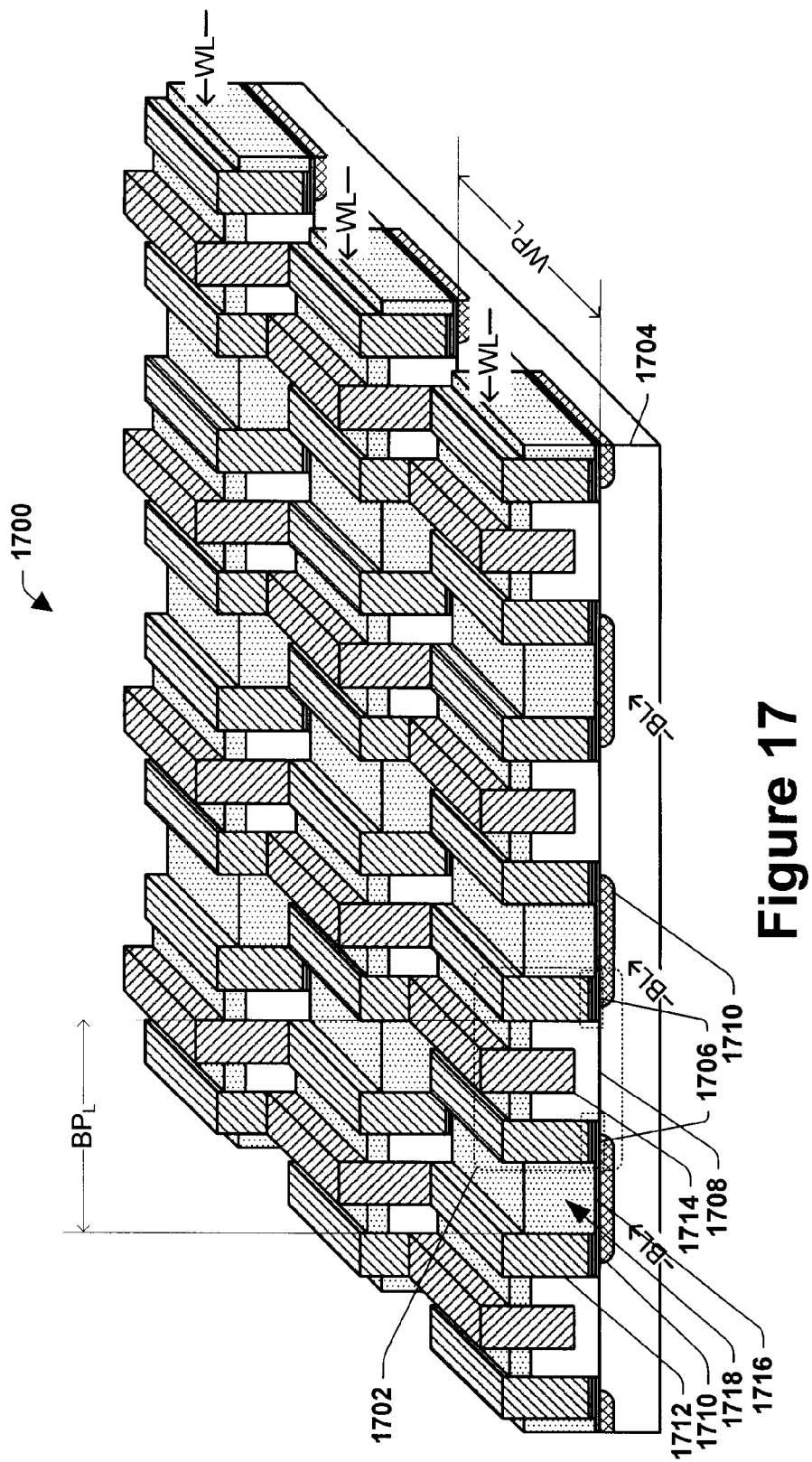
FIG. 17 illustrates a perspective view of a portion of another exemplary semiconductor structure containing two or more memory cells having two split sub-lithographic charge storage nodes on a semiconductor substrate in accordance with an aspect of the subject invention.

FIG. 17 illustrates a perspective view of a portion of a semiconductor structure 1700 containing two or more memory cells 1702 on a semiconductor substrate 1704. The semiconductor structure 1700 can contain any suitable number of the memory cells 1702 in an array with rows as indicated by arrows WL (e.g., word lines) and columns as indicated by arrows BL (e.g., bit lines). The memory cell 1702 contains two split sub-lithographic charge storage nodes 1706 containing a first oxide layer, nitride layer, and second oxide layer; a dielectric 1708 such as a third oxide between the two sub-lithographic charge storage nodes 1706; implanted portions 1710 of the semiconductor substrate 1704 under the two sub-lithographic charge storage nodes 1706; two first poly gates 1712 on the two sub-lithographic charge storage nodes 1706; a second poly gate 1714 between the two sub-lithographic charge storage nodes 1706; and a third poly gate (not shown) over the two sub-lithographic charge storage nodes 1706. The two or more memory cells 1702 are separated by a fourth oxide 1716 in a bit line opening 1718.

The bit line pitch ($BP_L$) may vary and is not critical to the subject invention. Any suitable bit line pitch can be employed. The bit line pitch may depend on, for example, the desired implementations and/or the semiconductor structure being fabricated. For example, the bit line pitch ($BP_L$) is any of the bit line pitches of the semiconductor structure 100 as described above in connection with FIG. 2.

Two or more memory cells 1702 separated by the fourth oxide 1716 can form a row and two or more rows can be disposed on the semiconductor substrate 1704. The row may be referred to as a word line. The two or more word lines are separated by any suitable dielectric material (not shown). Examples of dielectric materials include a HDP oxide.

The length from one word line to another adjacent word line may be referred to as a word line pitch. The word line pitch ($WP_L$) may vary and is not critical to the subject invention. Any suitable word line pitch can be employed. The word line pitch may depend on, for example, the desired implementations and/or the semiconductor structure being fabricated. In one embodiment, the word line pitch ($WP_L$) is about 60 nm or more and about 350 nm or less. In another embodiment, the word line pitch ($WP_L$) is about 80 nm or more and about 310 nm or less. In yet another embodiment, the word line pitch ($WP_L$) is about 100 nm or more and about 250 nm or less. In still yet another embodiment, the word line pitch ($WP_L$) is about 180 nm.

Figure 18:
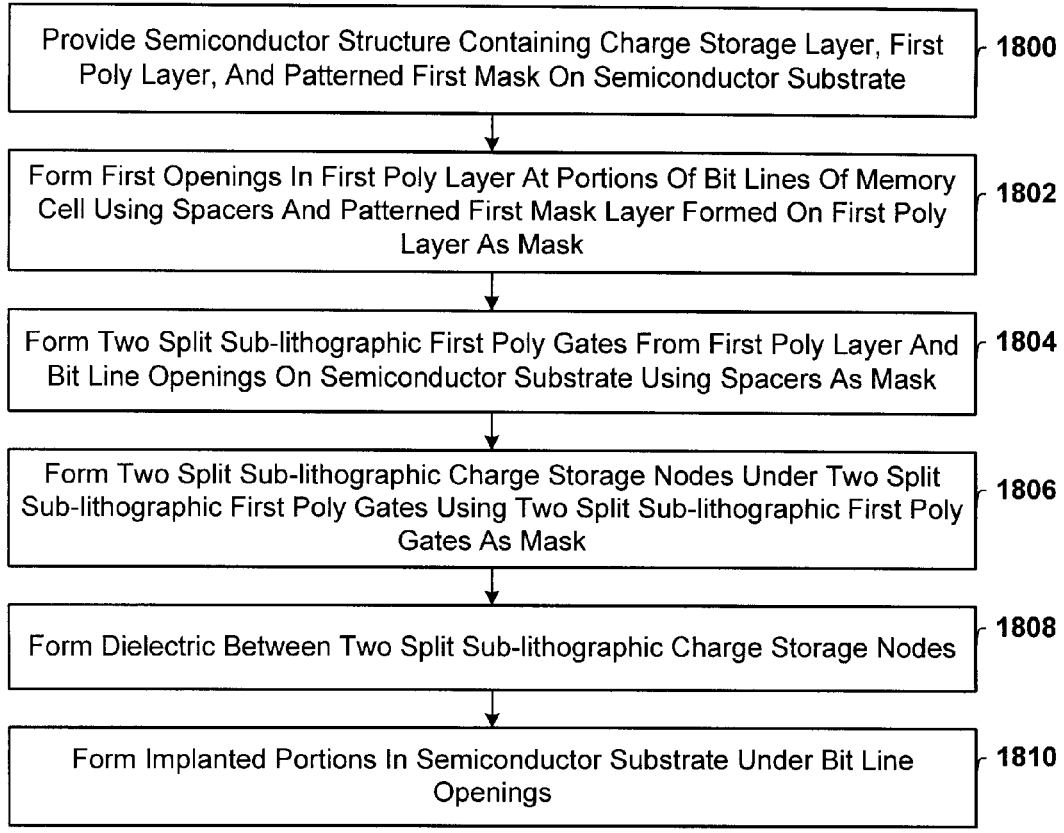
FIG. 18 illustrates an exemplary methodology for forming two split sub-lithographic charge storage nodes on a semiconductor substrate in accordance with an aspect of the subject invention.

FIG. 18 illustrates an exemplary methodology of forming a memory cell containing two split sub-lithographic charge storage nodes on a semiconductor substrate. At 1800, a semiconductor structure containing a charge storage layer, a first poly layer, and a patterned first mask on a semiconductor substrate is provided. At 1802, first openings in the first poly layer at portions of bit lines of the memory cell are formed using the patterned first mask layer and spacers formed on the first poly layer as a mask.

At 1804, two split sub-lithographic first poly gates are formed from the first poly layer using the spacers as a mask, and bit line openings are formed on the semiconductor substrate using spacers as a mask. At 1806, two split sub-lithographic charge storage nodes are formed under the two split sub-lithographic first poly gates using the two split sub-lithographic first poly gates as a mask. At 1808, a dielectric is formed between the two split sub-lithographic charge storage nodes. At 1810, implanted portions are formed in the semiconductor substrate under the bit line openings.

Figure 19:
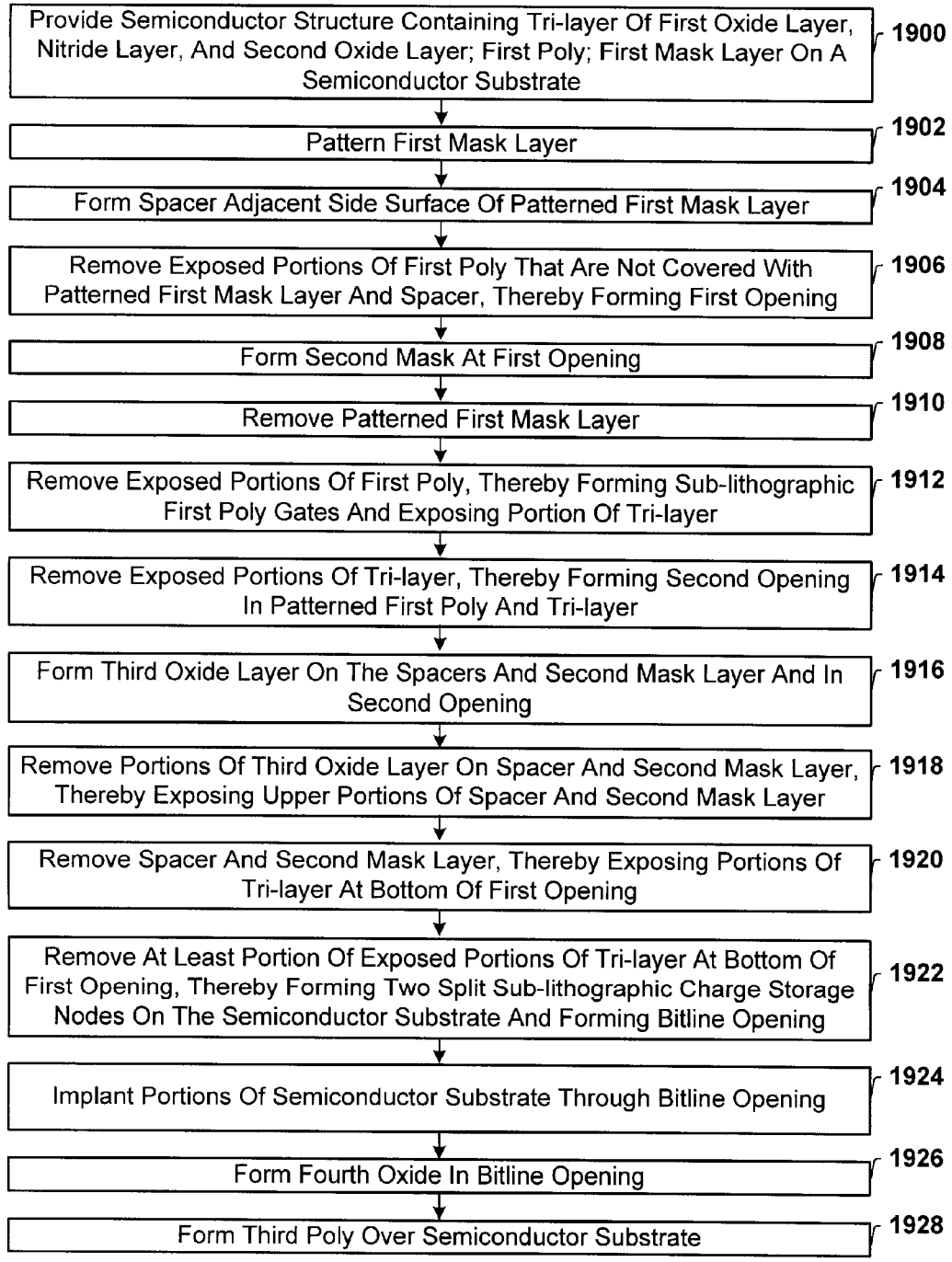
FIG. 19 illustrates another exemplary methodology for forming two split sub-lithographic charge storage nodes on a semiconductor substrate in accordance with an aspect of the subject invention.

FIG. 19 illustrates another exemplary methodology of forming a memory cell containing two split sub-lithographic charge storage nodes on a semiconductor substrate. At 1900, a semiconductor structure containing a charge storage layer, a first poly layer, and a first mask layer on a semiconductor substrate is provided. The charge storage layer may contain a tri-layer containing a first oxide layer, nitride layer, and second oxide layer. At 1902, the first mask layer is patterned by, for example, lithography and etching techniques.

At 1904, spacers are formed adjacent side surfaces of the patterned first mask layer and on portions of the upper surface of the first poly layer. The spacers can serve as a mask for forming sub-lithographic storage nodes in subsequent processes. At 1906, exposed portions of the first poly layer that are not covered with the patterned first mask layer and spacers are removed by, for example, etching, thereby forming first openings.

At 1908, a second mask layer is formed at the first openings. At 1910, the patterned first mask layer is removed by, for example, etching, thereby exposing portions of the patterned first poly layer. At 1912, the exposed portions of the patterned first poly layer are removed by, for example, etching, thereby exposing portions of the charge storage layer and forming sub-lithographic first poly gates.

At 1914, the exposed portions of the charge storage layer are removed by, for example, etching, thereby forming second openings. At 1916, a third oxide layer is formed on the spacers and second mask layer and in the second openings. In one embodiment, the third oxide layer does not fill the second opening, and after forming the third oxide layer in the second opening, there is a third opening in the second opening. When the third opening is formed, a second poly gate can be formed in the third opening.

At 1918, portions of the third oxide layer on the spacers and second mask layer are removed, thereby exposing upper portions of the spacers and second mask layer. At 1920, the spacers and second mask layer are removed, thereby exposing portions of charge storage layer at the bottom of the first opening.

At 1922, at least portion of exposed portions of charge storage layer at the bottom of the first opening are removed, thereby forming two split sub-lithographic charge storage nodes on the semiconductor substrate and forming bit line openings. At 1924, portions of the semiconductor substrate are implanted through the bit line openings. At 1926, fourth oxides are formed in the bit line openings. At 1928, a third poly gate is formed over the semiconductor substrate.

Although not shown, the methodologies of FIGS. 18 and 19 may include any suitable semiconductor structure fabrication processes. General examples of semiconductor structure fabrication processes include masking, patterning, etching, planarization, thermal oxidation, implant, annealing, thermal treatment, and deposition techniques normally used for making semiconductor structures.

The resultant memory cell formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory cell formed herein is useful in any electronic device such as a memory device. For example, the resultant memory cell is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A method of making a memory cell comprising two split sub-lithographic charge storage nodes, comprising:
    providing a charge storage layer, a first poly layer, and a first mask layer on a semiconductor substrate;
    patterning the first mask layer;
    forming spacers adjacent side surfaces of the patterned first mask layer and on portions of the upper surface of the first poly layer;
    removing exposed portions of the first poly layer that are not covered with the patterned first mask layer and spacers, thereby forming first openings;
    forming a second mask layer at the first openings;
    removing the patterned first mask layer, thereby exposing portions of the patterned first poly layer;
    removing the exposed portions of the patterned first poly layer, thereby exposing portions of the charge storage layer and forming two sub-lithographic first poly gates;
    removing the exposed portions of the charge storage layer, thereby forming second openings;
    forming a third oxide layer on the spacers and second mask layer and in the second openings;
    removing portions of the third oxide layer on the spacers and second mask layer, thereby exposing upper portions of the spacers and second mask layer;
    removing the spacers and second mask layer, thereby exposing portions of the charge storage layer at the bottom of the first opening;
    removing at least a portion of exposed portions of the charge storage layer at the bottom of the first opening, thereby forming two split sub-lithographic charge storage nodes between the sub-lithographic first poly gates and the semiconductor substrate, and forming bit line openings;
    implanting portions of the semiconductor substrate through the bit line openings;
    forming fourth oxides in the bit line openings; and
    forming a third poly gate over the semiconductor substrate.

2. The method of claim 1, wherein forming the third oxide layer comprises a high temperature oxide deposition process and forming the fourth oxides comprises a high density plasma oxide deposition process.

3. The method of claim 1, wherein forming bit line openings comprises removing substantially all of the exposed portions of the charge storage layer at the bottom of the first opening.

4. The method of claim 1, wherein while forming the second opening, upper portions of the spacer and second mask layer are removed.

5. The method of claim 1 further comprising forming a second poly gate between the two split sub-lithographic charge storage nodes on the semiconductor substrate.

6. The method of claim 1, wherein the spacer has a length of about 5 nm or more and about 50 nm or less.

7. The method of claim 1, wherein the sub-lithographic charge storage node has a length of about 5 nm or more and about 50 nm or less.

8. The method of claim 1, wherein the sub-lithographic charge storage node has a length of about 10 nm or more and about 40 nm or less.

9. The method of claim 1, wherein the sub-lithographic charge storage node has a length of about 15 nm or more and about 35 nm or less.

10. The method of claim 1, wherein the charge storage layer comprises a first oxide layer, nitride layer, and second oxide layer.

11. The method of claim 1, wherein forming the third oxide layer comprises a high temperature oxide deposition process.

12. The method of claim 1, wherein forming the third oxide layer comprises a plasma oxide deposition process.

13. The method of claim 1, wherein forming the third oxide layer comprises a slot plane antenna process.

14. The method of claim 1, wherein forming the fourth oxide comprises a high temperature oxide deposition process.

15. The method of claim 1, wherein forming the fourth oxide comprises a plasma oxide deposition process.

16. The method of claim 1, wherein forming the fourth oxide comprises a slot plane antenna process.

* * * * *